US008659955B2

(12) United States Patent
Jung et al.

(10) Patent No.: US 8,659,955 B2
(45) Date of Patent: Feb. 25, 2014

(54) MEMORY ARRAY HAVING WORD LINES WITH FOLDED ARCHITECTURE

(75) Inventors: Chulmin Jung, Eden Prairie, MN (US); Myron Buer, Savage, MN (US)

(73) Assignee: Broadcom Corporation, Irvine, CA (US)

( * ) Notice: Subject to any disclaimer, the term of this patent is extended or adjusted under 35 U.S.C. 154(b) by 191 days.

(21) Appl. No.: 13/213,019

(22) Filed: Aug. 18, 2011

(65) Prior Publication Data
US 2013/0044550 A1    Feb. 21, 2013

(51) Int. Cl.
*G11C 7/00* (2006.01)
*G11C 7/10* (2006.01)

(52) U.S. Cl.
USPC ............ 365/189.02; 365/185.23; 365/230.02; 365/230.03; 365/230.04; 365/230.06

(58) Field of Classification Search
USPC .................. 365/189.02, 230.06, 200, 185.23, 365/230.04, 185.11, 230.08, 189.04, 365/230.05, 230.03, 185.33, 230.02
See application file for complete search history.

(56) References Cited

U.S. PATENT DOCUMENTS

| | | | | |
|---|---|---|---|---|
| 5,898,637 A * | 4/1999 | Lakhani et al. | .......... | 365/230.06 |
| 6,977,860 B1 * | 12/2005 | Tooher et al. | ............ | 365/230.03 |
| 7,411,847 B2 * | 8/2008 | Terzioglu et al. | ............. | 365/201 |
| 8,004,912 B2 * | 8/2011 | Terzioglu et al. | ............. | 365/200 |
| 2008/0151630 A1 * | 6/2008 | Pan | ......................... | 365/185.18 |

\* cited by examiner

*Primary Examiner* — Toan Le
(74) *Attorney, Agent, or Firm* — Farjami & Farjami LLP

(57) ABSTRACT

According to an exemplary embodiment, a memory array arrangement includes a plurality of word lines, where at least two of the plurality of word lines are concurrently active word lines. Each of the plurality of word lines drive at least one group of columns. The memory array arrangement also includes a multiplexer for coupling one memory cell in a selected group of columns to at least one of the plurality of sense amps, thereby achieving a reduced sense amp-to-column ratio. The memory array arrangement further includes a plurality of I/O buffers each corresponding to the at least one of the plurality of sense amps. The memory array arrangement thereby results in the plurality of word lines having reduced resistive and capacitive loading.

20 Claims, 3 Drawing Sheets

MEMORY ARRAY HAVING WORD LINES WITH FOLDED ARCHITECTURE

BACKGROUND OF THE INVENTION

1. Field of the Invention

The present invention relates generally to semiconductor devices. More particularly, the present invention relates to semiconductor memory arrays.

2. Background Art

As known in the art, memory arrays include bit lines, sense amps, word lines, and memory cells. Examples of memory cells include static random-access memory (SRAM) cells, dynamic random-access memory (DRAM) cells, read-only memory (ROM) cells, and the like. In order to satisfy International Technology Roadmap for Semiconductors (ITRS) targets regarding area occupied by a memory array, process technologies continue to shrink. For example, ITRS targets aim for the area to be reduced by 50% per generation for SRAM-based memory arrays. While many benefits accrue from memory arrays occupying a smaller area, various challenges are also introduced as areas shrink that can increase layout area and cost of memory arrays.

As one example, shrinking memory arrays have resulted in a narrowing of word lines for memory arrays thereby increasing sheet resistance. Furthermore, overall cross-sectional area of the word lines has decreased, thereby increasing current density and impairing electromigration in the word lines. Moreover, due to increased density of memory arrays and larger number of memory cells, capacitive loading on word lines has also significantly increased. As a result, the word lines have increased resistive and capacitive loading, resulting in a high resistive-capacitive (RC) delay that decreases performance of the memory array. Splitting each of the word lines into two segments and inserting a buffer between the two segments to rebuffer a signal from a word line driver may address some of these issues. However, the buffer would introduce delay to the signal and would increase layout area. Furthermore, memory arrays have shrunk to a point where design choices are limited. For example, certain spacings are required to avoid excessive multi-bit upsets in memory cells, which result in an unacceptable soft error rate (SER).

Thus, there is need in the art for memory arrays that can overcome the drawbacks and deficiencies in the art, such as those mentioned above.

SUMMARY OF THE INVENTION

A memory array having word lines with folded architecture, as shown in and/or described in connection with at least one of the figures, and as set forth more completely in the claims.

DETAILED DESCRIPTION OF THE INVENTION

The present application is directed to a memory array having word lines with folded architecture. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1:
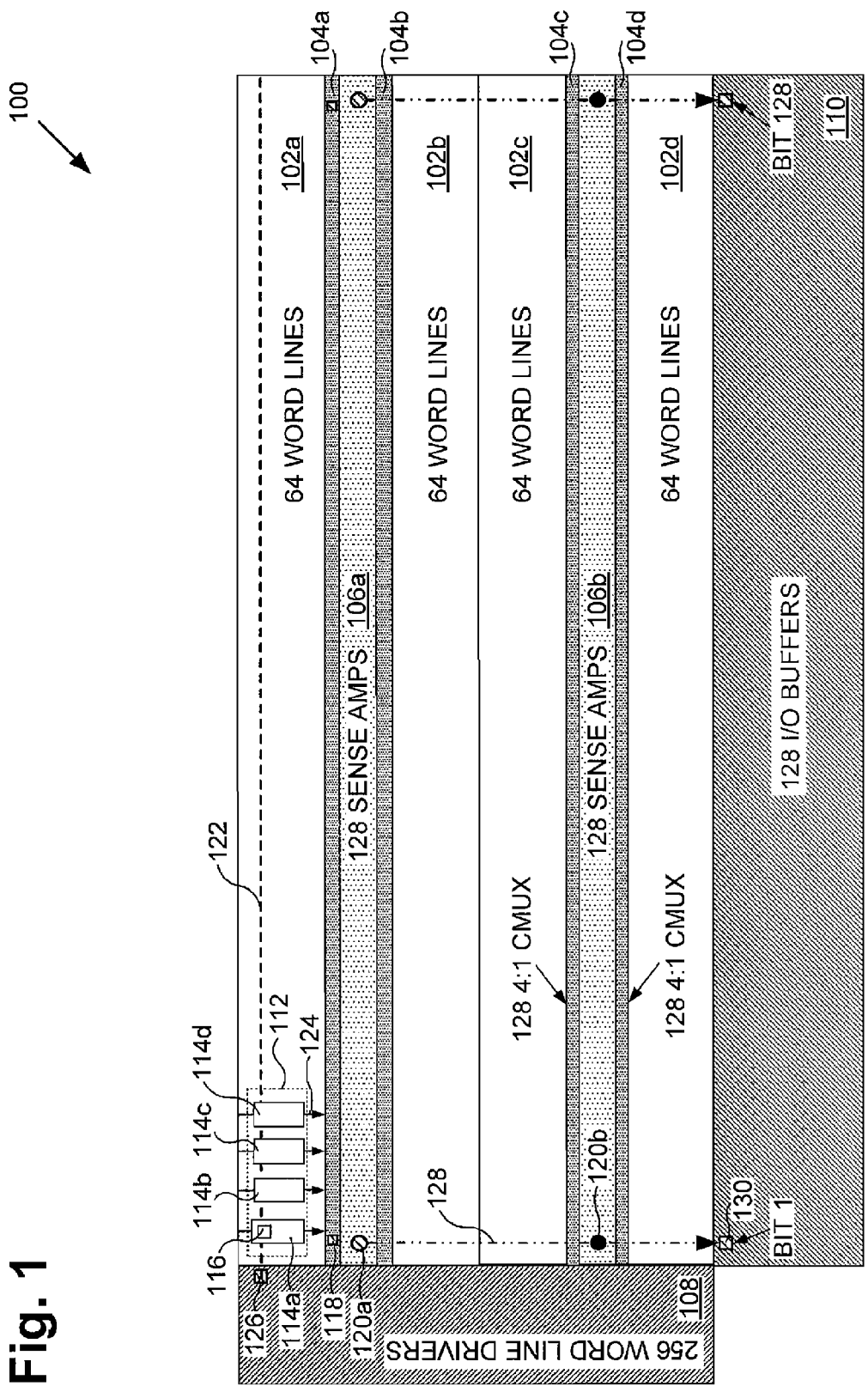
FIG. 1 illustrates a top view of a conventional memory array arrangement.

FIG. 1 illustrates a top view of memory array arrangement 100. Memory array arrangement 100 includes memory cell banks 102a, 102b, 102c, and 102d (also referred to as "memory cell banks 102"), multiplexer banks 104a, 104b, 104c, and 104d (also referred to as "multiplexer banks 104" and "multiplexers 104"), sense amp banks 106a and 106b (also referred to as "sense amp banks 106" and "sense amps 106"), word line drivers 108, and input/output (I/O) buffers 110.

In FIG. 1, each of memory cell banks 102 includes 128 groups of columns, such as group of columns 112, which each comprise four columns, such as columns 114a, 114b, 114c, and 114d (also referred to as columns 114). Columns 114 each comprise 64 memory cells, such as memory cell 116. Memory cell banks 102 also each include 64 word lines, such as word line 122, and 512 local bit lines (which can each be part of a bit line pair), such as local bit line 124. Each of the plurality of word lines are for driving at least one group of columns. For example, word line 122 is for driving group of columns 112. Memory array arrangement 100 includes 256 word line drivers 108, each for driving a respective word line. For example, word line driver 126 is for driving word line 122.

Also shown in FIG. 1, multiplexer banks 104 each include 128 multiplexers, such as multiplexer 118. Sense amp banks 106 each include 128 sense amps, such as sense amps 120a and 120b. Each of multiplexers 104 are for coupling one memory cell in a selected group of columns to at least one of a plurality of sense amps. In the present embodiment, multiplexer 118 can couple memory cell 116, or another memory cell in group of columns 112 to sense amp 120a. Thus, sense amp 120a can accommodate all four of group of columns 112 instead of requiring one sense amp per column. Multiplexers 104 can thereby achieve a reduced sense amp-to-column ratio. For example, only 128 sense amps are required for 512 columns in memory cell bank 102a. Furthermore, multiplexers 104b are for coupling another memory cell in another selected group of columns in memory cell bank 102b to sense amp 120a. By having a similar or same arrangement for all of sense amps 106 and multiplexers 104, a reduced sense amp-to-column ratio is achieved.

Sense amps 106a and sense amps 106b are both connected to a corresponding one of 128 global bit lines. For example, sense amp 120a and sense amp 120b are both connected to global bit line 128. Furthermore, each of the 128 global bit lines are connected to a corresponding one of 128 I/O buffers 110, such as I/O buffer 130. For example, global bit line 128 is connected to I/O buffer 130. I/O buffers 110 each correspond to at least one of sense amps 106.

Thus, as described above, each of memory cell banks 102 includes 128 groups of columns, which each has four columns, for a total of 512 columns. Furthermore, each column includes 64 memory cells, for a total of 256 memory cells per column. Thus, memory array arrangement 100 comprises 131,072 memory cells, which can each store one bit of data.

In operating memory array arrangement 100, one of the 256 word lines is active to access a 128-bit word of memory cells in memory array arrangement 100. For example, FIG. 1 shows that word line 122 is an active word line. Furthermore, one of sense amp banks 106 is active, which corresponds to the active word line. For example, FIG. 1 shows that sense amp bank 106a is active by illustrating sense amp 120a with light shading, while showing that sense amp bank 106b is not active by illustrating sense amp 120b with dark shading. Also, each of the 128 global bit lines is active and I/O buffers 110 are active. For example, FIG. 1 shows that global bit line 128 and I/O buffer 130 are active.

In order to satisfy International Technology Roadmap for Semiconductors (ITRS) targets regarding area occupied by a memory array, such as memory array arrangement 100, process technologies continue to shrink. For example, ITRS targets aim for area to be reduced by 50% per generation for SRAM-based memory arrays, which can be one implementation of memory array arrangement 100. While it would be beneficial for memory array arrangement 100 to occupying a smaller area, various challenges are also introduced as areas shrink that can limit configurations, increase layout area, and increase cost of memory array arrangement 100.

As one example, shrinking memory array arrangement 100 would result in a narrowing of word lines, such as word line 122, thereby increasing sheet resistance. Furthermore, overall cross-sectional area of word line 122 would decrease, thereby increasing current density and impairing electromigration of word line 122. As a result, word line 122 would have increased resistive and capacitive loading, resulting in a high resistive-capacitive (RC) delay that decreases performance of memory array arrangement 100. Splitting each of the word lines in memory array arrangement 100 into two segments and inserting a buffer between the two segments to rebuffer signals from word line drivers 108 may address some of these issues. However, the buffer would introduce delay to the signal and would increase layout area. Furthermore, memory arrays have shrunk to a point where configurations are limited. For example, certain spacings are required to avoid excessive multi-bit upsets in memory cells, such as memory cell 116, which result in an unacceptable SER.

In accordance with various embodiments of the present invention, memory array arrangements are provided having word lines with folded architecture, which can decrease current density and improve electromigration in the word lines. Thus, the word lines can have reduced resistive and capacitive loading, resulting in a low resistive-capacitive (RC) delay. Furthermore, the memory array arrangements offer new configurations, which can be utilized while maintaining spacings that are required to avoid excessive multi-bit upsets in memory cells, thereby avoiding an unacceptable SER.

Figure 2:
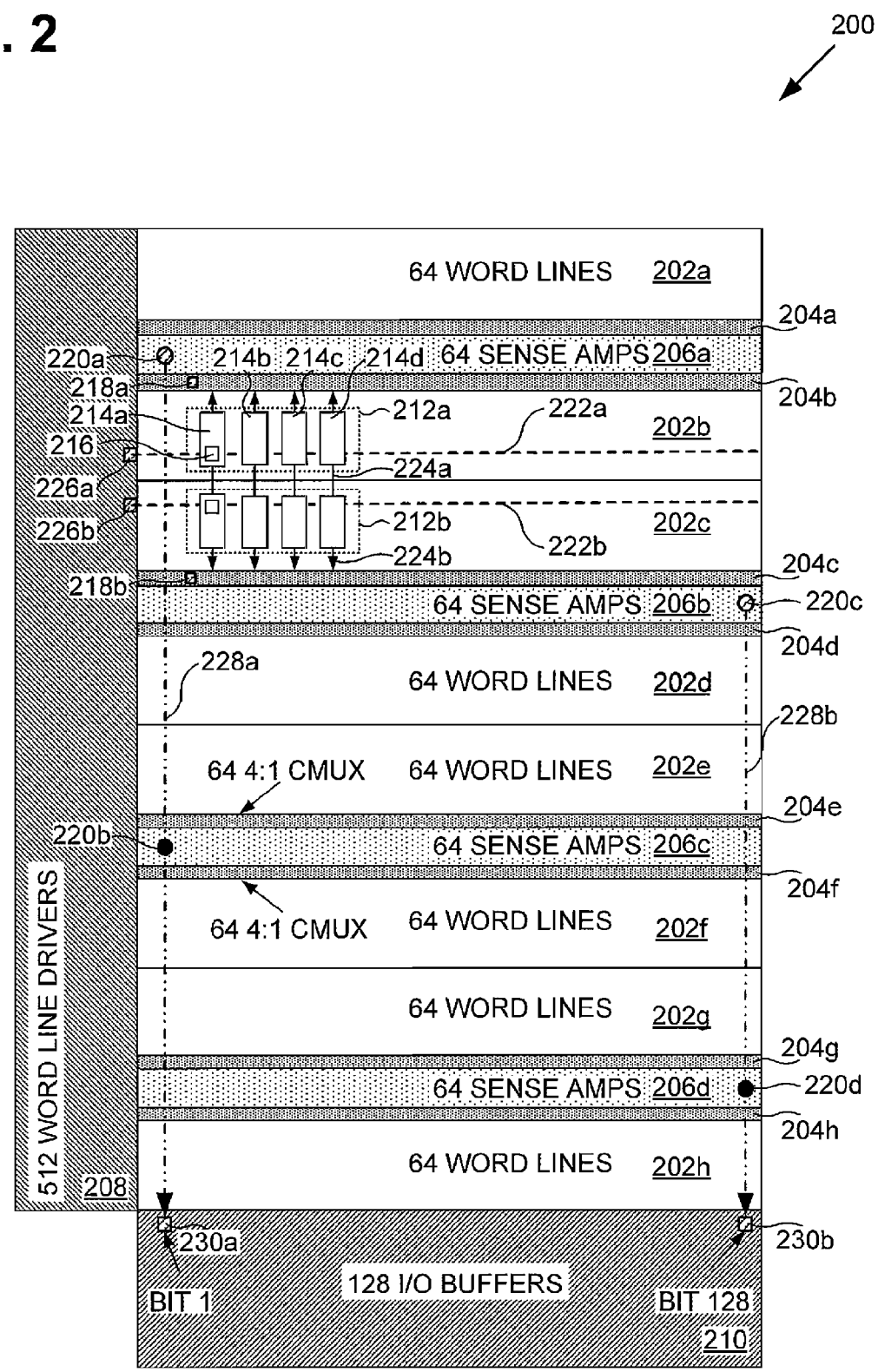
FIG. 2 illustrates a top view of a memory array arrangement, in accordance with one embodiment of the present invention.

Referring now to FIG. 2, FIG. 2 illustrates a top view of a memory array arrangement 200, in accordance with one embodiment of the present invention. Memory array arrangement 200 includes memory cell banks 202a, 202b, 202c, 202d, 202e, 202f, 202g, and 202h (also referred to as "memory cell banks 202"), multiplexer banks 204a, 204b, 204c, 204d, 204e, and 204f (also referred to as "multiplexer banks 204" and "multiplexers 204"), sense amp banks 206a, 206b, 206c, and 206d (also referred to as "sense amp banks 206" and "sense amps 206"), word line drivers 208, and I/O buffers 210.

In FIG. 2, each of memory cell banks 202 includes 64 groups of columns, such as group of columns 212a and 212b, which each comprise four columns, such as columns 214a, 214b, 214c, and 214d (also referred to as columns 214). Columns 214 each comprise 64 memory cells, such as memory cell 216. Memory cell banks 202 also each include 64 word lines, such as word lines 222a and 222b, and 256 local bit lines, such as local bit lines 224a and 224b. In the present embodiment, each of the plurality of word lines are for driving only one group of columns. For example, word line 222a is for driving group of columns 212a and word line 222b is for driving group of columns 212b. In other embodiments, each of the plurality of word lines are for driving at least one group of columns. Memory array arrangement 200 includes 512 word line drivers 208, each for driving a respective word line. For example, word line driver 226a is for driving word line 222a and word line driver 226b is for driving word line 222b.

Also shown in FIG. 2, multiplexer banks 204 each include 64 multiplexers, such as multiplexers 218a and 218b. Sense amp banks 206 each include 64 sense amps, such as sense amps 220a, 220b, 220c, and 220d. Each of multiplexers 204 are for coupling one memory cell in a selected group of columns to at least one of a plurality of sense amps. In the present embodiment, multiplexer 218b can couple memory cell 216, or another memory cell in group of columns 212a to only one sense amp, sense amp 220a. Thus, sense amp 220a can accommodate all four of group of columns 212a instead of requiring one sense amp per column. As such, each of multiplexers 204 are four to one (4:1) column multiplexers (CMUXs) and can thereby achieve a reduced sense amp-to-column ratio. For example, only 64 sense amps are required for 256 columns in memory cell bank 202b. Furthermore, multiplexers 204a are for coupling another memory cell in another selected group of columns in memory cell bank 202a to sense amp 220a. By having a similar or same arrangement for all of sense amps 206 and multiplexers 204, a reduced sense amp-to-column ratio is achieved.

Additionally, in conventional memory array arrangements, two to one (2:1) column multiplexing is not possible because twice as many multiplexers would be required to fit in a same area as compared to four to one (4:1) column multiplexing. This reduced spacing would cause excessive multi-bit upsets in memory cells, resulting in an unacceptable SER. However, memory array arrangement 200 advantageously logically achieves 2:1 column multiplexing while physically utilizing 4:1 CMUXs, thereby maintaining spacing and allowing for new design choices.

Sense amps 206a, 206b, 206c, and 206d are both connected to a corresponding one of 128 global bit lines. For example, sense amp 220a and sense amp 220b are both connected to global bit line 228a. Similarly, sense amp 220c and sense amp 220d are both connected to global bit line 228b. Furthermore, each of the 128 global bit lines are connected to a corresponding one of 128 I/O buffers 210, such as I/O buffers 230a and 230b. For example, global bit line 228a is connected to I/O buffer 230a and global bit line 228b is connected to I/O buffer 230b. I/O buffers 210 each correspond to at least one of sense amps 206.

In memory array arrangement 200, global bit line 228a is connected to sense amp 220a in sense amp bank 206a and is connected to sense amp 220b in sense amp bank 206c. However, global bit line 228a is not connected to a sense amp in sense amp banks 206b or 206d. Each global bit line that corresponds to an odd bit number has a similar or same arrangement as global bit line 228a. Also in memory array arrangement 200, global bit line 228b is connected to sense amp 220c in sense amp bank 206b and is connected to sense amp 220d in sense amp bank 206d. However, global bit line 228b is connected to a sense amp in sense amp banks 206a or 206c. Each global bit line that corresponds to an even bit number has a similar or same arrangement as global bit line 228b.

Thus, as described above, each of memory cell banks 202 includes 64 groups of columns, which each has four columns, for a total of 256 columns. Furthermore, each column includes 64 memory cells, for a total of 512 memory cells per column. Thus, memory array arrangement 200 comprises 131,072 memory cells, which can each store one bit of data. As such, memory array arrangement 200 can store a similar or same amount of data as memory array arrangement 100 in FIG. 1.

Memory array arrangement 200 has word lines with a folded architecture where, in operating memory array arrangement 200, two of the 512 word lines are concurrently active to access a 128-bit word of memory cells in memory array arrangement 200. For example, FIG. 2 shows that word lines 222a and 222b are concurrently active word lines. Furthermore, one of sense amp banks 206 is active per word line, which corresponds to an active word line. For example, FIG. 2 shows that sense amp banks 206a and 206b are active by illustrating sense amps 220a and 220c with light shading, while showing that sense amp banks 206c and 206d are not active by illustrating sense amps 220b and 220d with dark shading. Also, each of the 128 global bit lines and I/O buffers 210 are active are active. For example, FIG. 2 shows that global bit lines 228a and 228b and I/O buffers 230a and 230b are active.

As described above, memory array arrangement 200 can store a similar or same amount of data as memory array arrangement 100 in FIG. 1. Furthermore, memory array arrangement 200 can also access a 128-bit word using 128 I/O buffers. However, word lines in memory array arrangement 200 can advantageously have approximately half the length of word lines in memory array arrangement 100. Thus, resistive and capacitive loading can advantageously each be reduced by half. As such, RC delay in a word line in FIG. 2, which is a product of resistance and capacitance, can be reduced to a quarter of a word line in FIG. 1, thereby achieving a 75% improvement in RC delay. For example, word line 222a in FIG. 2 has a 75% lower RC delay than word line 122 in FIG. 1.

It is noted that the present embodiment is not limited to the specific embodiment shown in FIG. 2. For example, in memory array arrangement 200, exactly two of the 512 word lines are concurrently active word lines. However, in accordance with various embodiments, at least two of a plurality of word lines are concurrently active word lines. Furthermore, because at least two of the plurality of word lines are concurrently active word lines, word line drivers 208 can be shared word line drivers. For example, while memory array arrangement 200 has been described as comprising 512 word line drivers, in another embodiment, memory array arrangement 200 has 256 word line drivers, where each word line driver is shared between at least two concurrently active word lines. For example, word lines 222a and 222b could share a word line driver, such as word line driver 226a. Thus, each of the plurality of word line drivers could drive two groups of columns. Each word line driver could be arranged within, for example, approximately double an area compared to having non-shared word line drivers. However, it is noted that having non-shared word line drivers may allow for easily changing which word lines are concurrently active.

In embodiments where word lines 222a and 222b share a word line driver, word lines could be combined into a single word line which can occupy approximately twice an area as compared to word line 122 by sharing the single word line amongst adjacent rows of memory cells. In such a configuration, an extra bit line could be utilized for memory cells in the adjacent rows, which previously shared a same bit line.

In FIG. 2, each of the word lines in memory array arrangement 200 could be split into two segments and with a buffer inserted between the two segments to rebuffer signals from word line drivers 208. However, such a configuration may be avoidable due to performance advantages offered by memory array arrangement 200.

Figure 3:
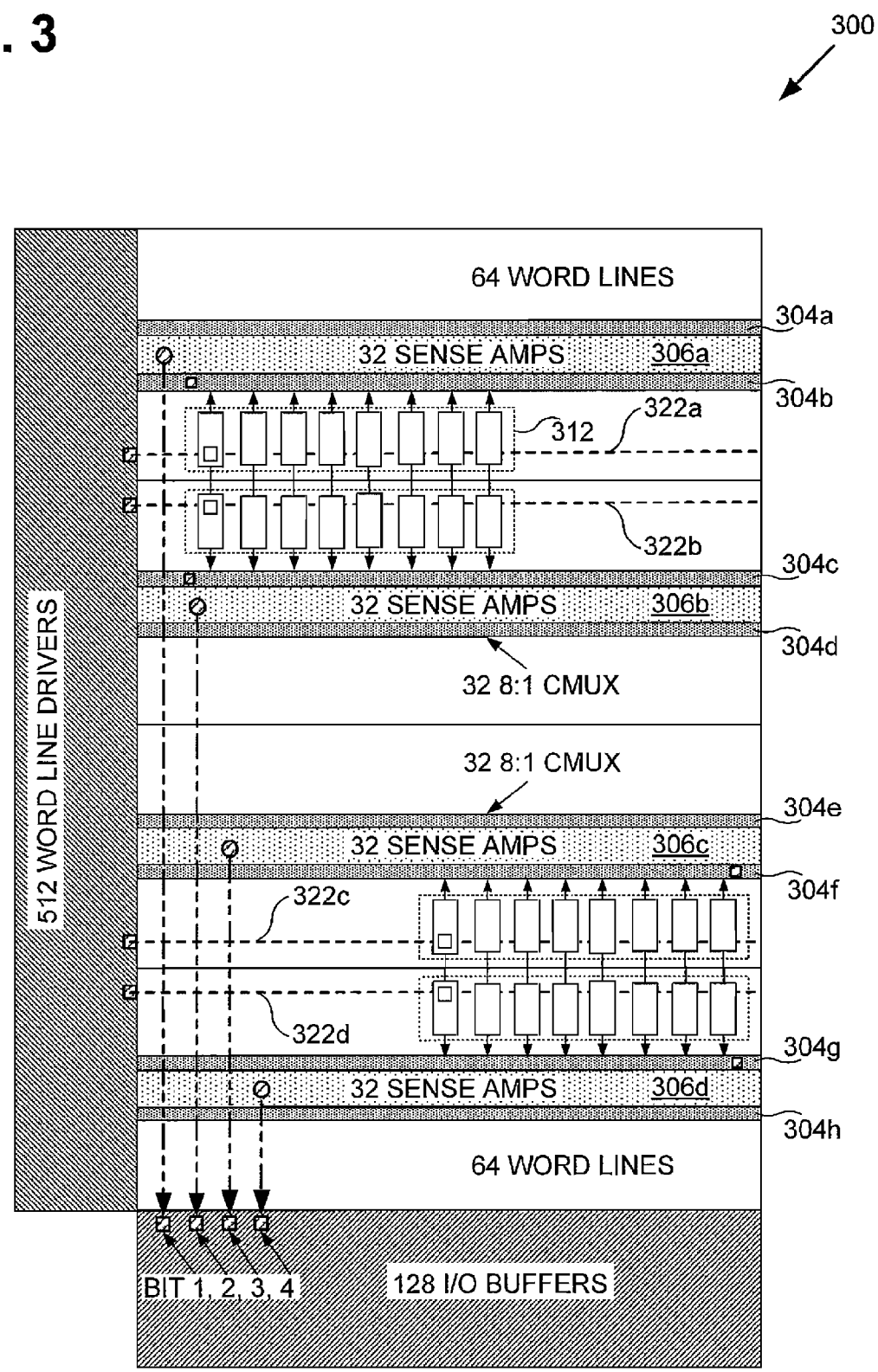
FIG. 3 illustrates a top view of a memory array arrangement, in accordance with one embodiment of the present invention.

In addition to the foregoing, embodiments of the present invention offer additional configurations, not previously achievable. Meanwhile, certain spacings required to avoid excessive multi-bit upsets in memory cells can be maintained, thereby avoiding an unacceptable SER. One such configuration is shown in FIG. 3. FIG. 3 shows a top view of memory array arrangement 300, in accordance with one embodiment of the present invention. Memory array arrangement 300 is similar to memory array arrangement 200 in FIG. 2. However, as shown in FIG. 3, memory array arrangement 300 has four of a plurality of word lines that are concurrently active word lines.

As shown in FIG. 3, memory array arrangement 300 has word lines 322a, 322b, 322c, and 322d, which are concurrently active word lines and have a folded architecture. By including additional concurrently active word lines, such as four concurrently active word lines, a quantity of sense amps and/or multiplexers can be reduced, thereby offering additional configurations for memory array arrangements. For example, a quantity of sense amps 206 in FIG. 2 can be reduced by approximately half. Thus, FIG. 3 shows sense amp banks 306a, 306b, 306c, and 306d (also referred to as "sense amp banks 306" and "sense amps 306") corresponding to sense amps 206 in FIG. 2. While sense amp banks 206 each include 64 sense amps, sense amp banks 306 include 32 sense amps. Thus, each of sense amps 306 can, for example, have approximately twice an area as sense amps 206.

Furthermore, because memory array arrangement 300 includes 32 sense amps in each sense amp bank 306, a quantity of multiplexers 204 in FIG. 2 can be reduced by approximately half as, in the present embodiments, each sense amp corresponds to one multiplexer. Thus, FIG. 3 shows multiplexer banks 304a, 304b, 304c, 304d, 304e, 304f, 304g, and 304h (also referred to as "multiplexer banks 304" and "multiplexers 304") corresponding to multiplexers 204 in FIG. 2. While multiplexer banks 204 each include 64 multiplexers, multiplexer banks 304 include 32 multiplexers. Thus, each of multiplexers 304 can, for example, have approximately twice an area as multiplexers 206.

In FIG. 3, each memory cell bank includes 32 groups of columns, such as group of columns 312, which each have eight columns. Group of columns 312, for example, is similar to group of columns 212 in FIG. 2, but includes more columns, as each of multiplexers 304 are now eight to one column multiplexers (CMUXs). Thus, the embodiment shown in FIG. 3 has a sense amp-to-column ratio that is further reduced from the embodiment shown in FIG. 2.

While in memory array arrangement 200, only half, e.g., two of sense amp banks 206 are active per access of memory cell banks 202, in memory array arrangement 300, all, e.g., four of sense amp banks 306 are active per access of corresponding memory cell banks. Memory array arrangement 300 includes 128 global bit lines. However, each global bit line is connected to a respective one of sense amp banks 306.

In memory array arrangement 300, each of sense amp banks 306 are connected to 32 global bit lines and corresponding I/O buffers in an alternating fashion as show in FIG. 3. Memory array arrangement 300 can advantageously free up additional area by reducing a quantity of sense amps and/or multiplexers, thereby offering a more flexible configuration. However, the embodiments discussed with respect to FIGS. 2 and 3 each can provide for an approximately 75% reduction to RC delay as compared to a similar memory array arrangement, such as memory array arrangement 100 in FIG. 1, which includes only a single active word line.

It is noted that the present embodiment is not limited to the specific embodiment shown in FIG. 3. For example, in memory array arrangement 300, exactly four of the 512 word, lines are concurrently active word lines. However, in accordance with various embodiments, at least four of a plurality of word lines are concurrently active word lines. Furthermore, it will be appreciated that embodiments of the present invention described above with respect to memory array arrangement 200 similarly apply to memory array arrangement 300. For example, similar to memory array arrangement 200, word line drivers can be shared word line drivers.

It is also noted that FIGS. 2 and 3 are specific embodiments, which can be varied. For example, additional I/O buffers can be provided and word sizes can be varied. Also, memory cells and/or sense amps can be arranged differently. Embodiments of the present invention may also include additional or different sense amps, multiplexers, and/or groups of columns. In one embodiment, for example, group of columns 212 has eight columns. Furthermore, bit lines, such as local and global bit lines, can be arranged differently from preferable embodiments shown herein. Also, memory cells in memory array arrangements 200 and 300 can be, for example, SRAM cells, DRAM cells, ROM cells, and the like.

Thus, as discussed above, embodiments of the present invention provide for memory array arrangements including a plurality of word lines having folded architecture, where at least two of the plurality of word lines are concurrently active word lines. Each of the plurality of word lines drives at least one group of columns and a multiplexer can couple one memory cell in a selected group of columns to at least one of a plurality of sense amps, thereby achieving a reduced sense amp-to-column ratio. A plurality of I/O buffers each correspond to the at least one of the plurality of sense amps. By having such an arrangement, the memory array arrangements can thereby result in the plurality of word lines having reduced resistive and capacitive loading. From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A memory array arrangement comprising:
   a plurality of word lines, wherein at least two of said plurality of word lines are concurrently active word lines;
   each of said plurality of word lines driving at least one group of columns;
   a multiplexer for coupling one memory cell in a selected group of columns to at least one of a plurality of sense amps, thereby achieving a reduced sense amp-to-column ratio;
   a plurality of I/O buffers each corresponding to said at least one of said plurality of sense amps, wherein at least two of said plurality of sense amps are concurrently active sense amps each coupled to one of said plurality of I/O buffers;
   said memory array arrangement thereby resulting in said plurality of word lines having, reduced resistive and capacitive loading.

2. The memory array arrangement of claim 1, further comprising another multiplexer for coupling another memory cell in another selected group of columns to said at least one of said plurality of sense amps, thereby achieving said reduced sense amp-to-column ratio.

3. The memory array arrangement of claim 1, wherein each of said plurality of word lines drives only one group of columns.

4. The memory array arrangement of claim 1, wherein each of said plurality of word lines drives two groups of columns.

5. The memory array arrangement of claim 1, wherein exactly two of said plurality of word lines are concurrently active word lines.

6. The memory array arrangement of claim 1, wherein said at least one group of columns has eight columns.

7. The memory array arrangement of claim 6, wherein said multiplexer is for coupling said one memory cell in said eight columns to only one sense amp of said plurality of sense amps.

8. The memory array arrangement of claim 1, wherein said at least one of said groups of columns has four columns.

9. The memory array arrangement of claim 8, wherein said multiplexer is for coupling said one memory cell in said four columns to only one of said plurality of sense amps.

10. The memory array arrangement of claim 1, wherein at least two of said concurrently active word lines have a shared word line driver.

11. A memory array arrangement comprising:
    a plurality of word lines, wherein at least four of said plurality of word lines are concurrently active word lines;
    each of said plurality of word lines driving at least one group of columns;
    a multiplexer for coupling one memory cell in a selected group of columns to at least one of a plurality of sense amps, thereby achieving a reduced sense amp-to-column ratio;
    a plurality of I/O buffers each corresponding to said at least one of said plurality of sense amps, wherein at least two of said plurality of sense amps are concurrently active sense amps each coupled to one of said plurality of I/O buffers;
    said memory array arrangement thereby resulting in said plurality of word lines having reduced resistive and capacitive loading.

12. The memory array arrangement of claim 11, further comprising another multiplexer for coupling another memory cell in another selected group of columns to said at least one of said plurality of sense amps, thereby achieving said reduced sense amp-to-column ratio.

13. The memory array arrangement of claim 11, wherein each of said plurality of word lines drives only one group of columns.

14. The memory array arrangement of claim 11, wherein each of said plurality of word lines drives two groups of columns.

15. The memory array arrangement of claim 11, wherein exactly four of said plurality of word lines are concurrently active word lines.

16. The memory array arrangement of claim 11, wherein said at least one group of columns has eight columns.

17. The memory array arrangement of claim 16, wherein said multiplexer is for coupling said one memory cell in said eight columns to only one of said plurality of sense amps.

18. The memory array arrangement of claim 11, wherein said at least one of said groups of columns has four columns.

19. The memory array arrangement of claim 18, wherein said multiplexer is for coupling said one memory cell in said four columns to only one of said plurality of sense amps.

20. The memory array arrangement of claim 11, wherein at least two of said concurrently active word lines have a shared word line driver.

\* \* \* \* \*